United States Patent
Ueda

(10) Patent No.: US 11,863,927 B2
(45) Date of Patent: Jan. 2, 2024

(54) AUDIO DEVICE PROXIMITY DETECTION

(71) Applicant: Bose Corporation, Framingham, MA (US)

(72) Inventor: Joji Ueda, Cambridge, MA (US)

(73) Assignee: Bose Corporation, Framingham, MA (US)

(*) Notice: Subject to any disclaimer, the term of this patent is extended or adjusted under 35 U.S.C. 154(b) by 338 days.

(21) Appl. No.: 16/689,297

(22) Filed: Nov. 20, 2019

(65) Prior Publication Data

US 2021/0152915 A1    May 20, 2021

(51) Int. Cl.
| | | |
|---|---|---|
| *H04R 1/10* | (2006.01) | |
| *H04R 5/033* | (2006.01) | |
| *G06F 3/044* | (2006.01) | |
| *G06F 3/06* | (2006.01) | |
| *G06F 3/16* | (2006.01) | |

(52) U.S. Cl.
CPC ........... *H04R 1/1041* (2013.01); *G06F 3/044* (2013.01); *G06F 3/165* (2013.01); *H04R 1/1016* (2013.01);
(Continued)

(58) Field of Classification Search
CPC .. H04R 1/1041; H04R 1/1066; H04R 1/1016; H04R 2225/61; H04R 25/65; H04R 2225/0213; H04R 2225/41; H04R 2225/43; H04R 2420/09; H04R 2430/21; H04R 2460/01; H04R 25/405; H04R 25/407; H04R 25/558; H04R 25/604; H04R 1/1025; H04R 1/1091; H04R 2420/07; H04R 25/554; H04R 25/602; H04R 5/033; H04R 1/028; H04R 1/1075; H04R 1/1083; H04R 1/24; H04R 1/2853; H04R 1/2857; H04R 2201/023; H04R 2201/028; H04R 2201/107; H04R 2225/55; H04R 2430/01; H04R 25/30; H04R 25/402; H04R 25/48; H04R 25/652; H04R 3/12; H04R 5/0335; H04R 1/02; H04R 2201/103; H04R 2225/31; H04R 25/556; H04R 3/00; H04R 5/04; H04R 1/1008; H04R 1/105;
(Continued)

(56) References Cited

U.S. PATENT DOCUMENTS 4,275,274 A * 6/1981 English ................. G08B 17/00
340/692
5,371,553 A * 12/1994 Kawamura ...... H04N 21/42204
725/59

(Continued)

*Primary Examiner* — Lun-See Lao
(74) *Attorney, Agent, or Firm* — Hoffman Warnick LLC

(57) ABSTRACT

Various aspects include approaches for proximity-based control in audio devices. In particular implementations, an audio system includes: a set of audio devices, each including: an electrode for detecting an electrical waveform, wherein the electrode comprises at least one of a capacitive electrode or an inductive electrode; and a controller coupled to the electrode, where the controller in a first one of the audio devices is configured to instruct the electrode in the first audio device to transmit an electrical waveform that is detectable by the electrode in a second one of the audio devices for indicating physical proximity of the first audio device to the second audio device, and in response to detecting the electrical waveform, the controller in the second audio device initiates a proximity-based action.

18 Claims, 3 Drawing Sheets

(52) U.S. Cl.
CPC ........... *H04R 1/1058* (2013.01); *H04R 5/033* (2013.01); *H04R 1/1025* (2013.01); *H04R 2420/07* (2013.01)

(58) Field of Classification Search
CPC ................ H04R 1/403; H04R 2420/03; H04R 2460/07; H04R 2460/13; H04R 2460/17; H04R 2499/15; H04R 25/60; H04R 25/70; H04R 3/007
USPC ...... 381/74, 323, 314, 322, 309, 312, 56–59
See application file for complete search history.

(56) References Cited

U.S. PATENT DOCUMENTS

| | | | | |
|---|---|---|---|---|
| 5,383,044 | A * | 1/1995 | Borchardt | H04B 10/114 |
| | | | | 340/12.5 |
| 10,182,282 | B2 * | 1/2019 | McPeak | H01R 13/521 |
| 2013/0231046 | A1 * | 9/2013 | Pope | G06F 3/0446 |
| | | | | 455/41.1 |
| 2014/0173439 | A1 * | 6/2014 | Gutierrez | G08B 21/0236 |
| | | | | 715/727 |
| 2015/0091691 | A1 * | 4/2015 | Calatayud | G06F 1/182 |
| | | | | 340/4.4 |
| 2017/0164089 | A1 * | 6/2017 | Lee | H04R 1/1025 |
| 2018/0096770 | A1 * | 4/2018 | Danielson | H04R 1/10 |
| 2020/0037058 | A1 * | 1/2020 | Ueda | G06F 3/017 |
| 2020/0100010 | A1 * | 3/2020 | Yang | H04R 1/10 |
| 2020/0204898 | A1 * | 6/2020 | Schoeck | G06F 3/167 |
| 2021/0027199 | A1 * | 1/2021 | Avery | G06F 3/04883 |

\* cited by examiner

AUDIO DEVICE PROXIMITY DETECTION

TECHNICAL FIELD

This disclosure generally relates to device proximity detection. More particularly, the disclosure relates to proximity-based control in audio devices.

BACKGROUND

The proliferation of portable speaker systems and audio devices (e.g., wearable audio devices) has enabled dynamic user experiences. These systems and devices can provide immersive experiences for users. However, often because of the dynamic nature of these systems and devices, it is not always possible to detect the state of one or more devices. Battery conservation, device pairing and playback control can all be enhanced when device state is known.

SUMMARY

All examples and features mentioned below can be combined in any technically possible way.

Various implementations of the disclosure include systems and computer-implemented methods for controlling a set of audio devices. Various particular implementations of the disclosure include approaches for proximity-based control of audio devices.

In some particular aspects, an audio system includes: a set of audio devices, each including: an electrode for detecting an electrical waveform, wherein the electrode includes at least one of a capacitive electrode or an inductive electrode; and a controller coupled to the electrode, where the controller in a first one of the audio devices is configured to instruct the electrode in the first audio device to transmit an electrical waveform that is detectable by the electrode in a second one of the audio devices for indicating physical proximity of the first audio device to the second audio device, and in response to detecting the electrical waveform, the controller in the second audio device initiates a proximity-based action.

In other particular aspects, a computer-implemented method of controlling a set of audio devices is disclosed. Each audio device includes an electrode for detecting an electrical waveform and a controller coupled to the capacitive electrode, where the electrode includes at least one of a capacitive electrode or an inductive electrode. The method includes: at the controller in a first one of the audio devices: instructing the electrode to transmit an electrical waveform that is detectable by the electrode in a second one of the audio devices for indicating physical proximity of the first audio device to the second audio device; and at the controller in the second audio device: initiating a proximity-based action in response to detecting the electrical waveform.

Implementations may include one of the following features, or any combination thereof.

In certain aspects, the controller in the second audio device is configured to instruct the electrode in the second audio device to transmit a distinct electrical waveform that is detectable by the electrode in the first audio device for indicating physical proximity of the first audio device to the second audio device, and in response to detecting the distinct electrical waveform, the controller in the first audio device initiates the proximity-based action.

In particular cases, the electrode in the first audio device includes the capacitive electrode having a capacitive touch electrode, where the electrode in the second audio device includes the capacitive electrode, and the controller in the first audio device is configured to alternate, in a repeating pattern, between: instructing the capacitive electrode in the first audio device to transmit the electrical waveform detectable by the capacitive electrode in the second audio device, and instructing the capacitive electrode in the first audio device to transmit an additional electrical waveform for detecting a user touch command at a capacitive touch interface connected with the capacitive touch electrode.

In certain implementations, the first audio device and the second audio device are audio devices each having an acoustic transducer coupled with the respective controllers, where the audio devices include a set of earbuds.

In particular aspects, detecting the electrical waveform indicates that the earbuds are not worn by a user.

In some cases, the controller in the first audio device is configured to instruct the electrode to transmit the electrical waveform on a recurring basis, and in response to failing to detect the electrical waveform, the controller in the second audio device is configured to wake the second audio device to provide an audio output.

In certain implementations, the controller in the second audio device is configured to wake the second audio device after having previously taken the proximity-based action.

In particular cases, the proximity-based action includes switching the second audio device to a hibernate mode, powering down the second audio device, pairing or connecting the first audio device and the second audio device, or pairing or connecting at least one of the first audio device or the second audio device to an audio playback device.

In some aspects, the first audio device and the second audio device each include distinct speakers.

In certain cases, the proximity-based action includes assigning channel outputs for the distinct speaker systems to configure audio playback at the distinct speakers as a stereo coupled unit.

In particular implementations, the distinct speakers each include at least two electrodes on opposing sides of a speaker housing, where assigning the channel outputs is based upon a detected left/right orientation of the distinct speakers relative to one another.

In some aspects, the first audio device includes a master speaker and the second audio device includes a puppet speaker, and the controller at the master speaker is configured to decouple the stereo coupled unit in response to detecting that the puppet speaker is physically separated from the master speaker beyond a wireless communication range.

In certain cases, the first audio device includes a speaker, the second audio device includes a control device for the speaker, and the proximity-based action includes powering down the speaker, switching the speaker to a hibernate mode, or pairing or connecting the control device with the speaker.

In particular aspects, the set of devices includes a third device, the second audio device and the third device are audio devices each with an acoustic transducer coupled with the respective controllers, the first audio device includes a docking station for the audio devices, and the electrical waveform sent by the docking station is detectable by the electrode in each of the second audio device and the third device for indicating physical proximity of the audio devices and the docking station, and in response to detecting the electrical waveform, the controller in at least one of the second audio device or the third device initiates the proximity-based action.

In some implementations, the controller in each of the audio devices is further configured to instruct the respective electrode to transmit a distinct electrical waveform that is detectable by the electrode in at least one of the other audio device or the docking station for indicating physical proximity to at least one of the other device or the docking station, and in response to detecting the electrical waveform, the controller in the respective audio device or the docking station initiates the proximity-based action.

In particular aspects, the proximity-based action includes at least one of powering down the audio devices or terminating audio playback at the audio devices.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
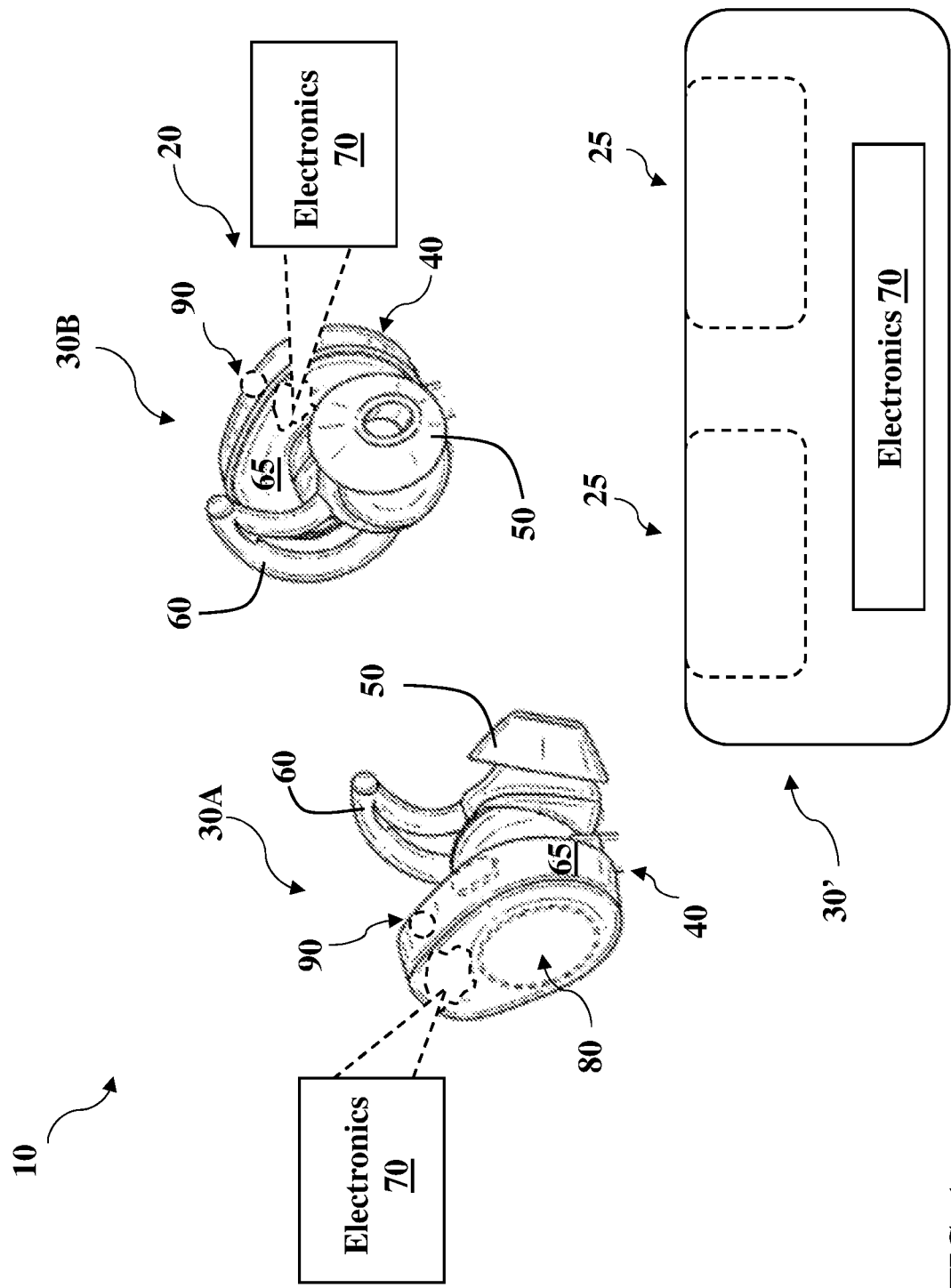
FIG. 1 shows a schematic depiction of an audio system including a wearable audio device according to various implementations.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to proximity-based control of devices. More particularly, aspects of the disclosure relate to systems and approaches for controlling proximity-based actions in devices, for example, audio devices.

Commonly labeled components in the FIGURES are considered to be substantially equivalent components for the purposes of illustration, and redundant discussion of those components is omitted for clarity.

Aspects and implementations disclosed herein may be applicable to a wide variety of electronic devices that can benefit from proximity detection. That is, various implementations disclosed herein can be applicable to electronic devices where detected proximity can be used to control one or more of device functions. In particular cases, devices disclosed herein can include audio devices such as speaker systems. The speaker systems can include any movable or otherwise portable speaker system (e.g., Wi-Fi and/or Bluetooth speaker systems, home speaker systems, etc.), as well as wearable audio devices in various form factors, such as headphones (whether on or off ear), headsets, watches, eyeglasses, neck-worn speakers, shoulder-worn speakers, body-worn speakers, etc. Unless specified otherwise, the term wearable audio device, as used in this document, includes headphones and various other types of personal audio devices such as head, shoulder or body-worn acoustic devices that include one or more acoustic drivers to produce sound. Some particular aspects disclosed may be particularly applicable to speaker systems including personal (wearable) audio devices such as in-ear headphones (also referred to as earbuds), eyeglasses or other head-mounted audio devices.

While described by way of example, wearable audio devices such as in-ear headphones (e.g., earbuds), audio accessories or clothing (e.g., audio hats, audio visors, audio jewelry, neck-worn speakers or audio eyeglasses (also referred to as eyeglass headphones) herein, the wearable audio devices disclosed herein can include additional features and capabilities. That is, the wearable audio devices described according to various implementations can include features found in one or more other wearable electronic devices, such as smart glasses, smart watches, etc. These wearable audio devices can include additional hardware components, such as one or more cameras, location tracking devices, microphones, etc., and may be capable of voice recognition, visual recognition, and other smart device functions. The description of wearable audio devices included herein is not intended to exclude these additional capabilities in such a device.

Various particular implementations include audio devices and approaches for controlling functions of those devices based on the detected proximity to additional devices. In certain implementations, a system includes a set of devices (e.g., two or more devices, including at least one audio device) that are configured to detect proximity to one another in order to initiate a proximity-based action. In certain cases, each of the devices includes an electrode for detecting an electrical waveform from another one of the devices for indicating physical proximity of those devices. Based upon the detected physical proximity, the controller at one or more devices takes a proximity-based action, e.g., switching device(s) to a hibernate mode, powering down the device(s), pairing the devices with one another, pairing the device(s) with an audio playback device, or assigning channel outputs for distinct devices in the system.

Figure 2:
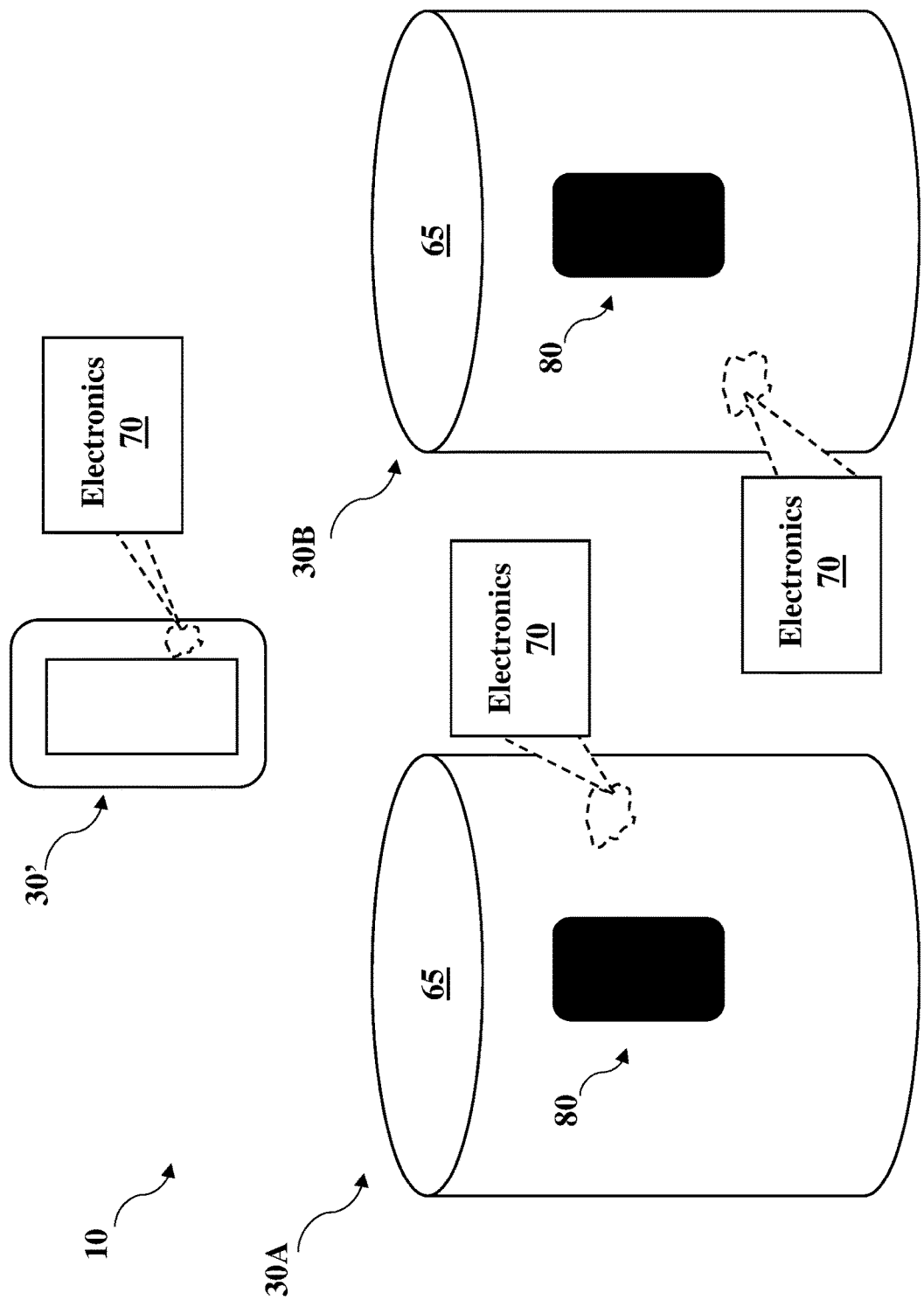
FIG. 2 is a schematic depiction of an additional audio system including a set of speakers according to various implementations.

FIG. 1 and FIG. 2 illustrate examples of systems and devices that may incorporate the teachings of the various implementations. These examples are not intended to be limiting.

FIG. 1 is a schematic depiction of a first example audio system 10. In this example, the audio system 10 is an audio headset 20 having a pair of audio devices 30, which in this particular implementation, are two distinct earbuds (or, in-ear headphones) 30A, 30B. While the audio devices (or, earbuds) 30 are shown in a "true" wireless configuration (i.e., without tethering between earbuds), the audio headset 20 could also include a tethered wireless configuration (whereby the earbuds are connected via wire with a wireless connection to a playback device) or a wired configuration (whereby at least one of the earbuds has a wired connection to a playback device). Each audio device 30 is shown including a body 40, which can include a casing formed of one or more plastics or composite materials. The body 40 can include a nozzle 50 for insertion into a user's ear canal entrance, a support member 60 for retaining the nozzle 50 in a resting position within the user's ear, and an outer casing 65 for housing electronics 70, including components of an interface 80. In some cases, separate, or duplicate sets of electronics 70 are contained in portions of the audio device 30, e.g., each of the respective audio devices 30. However, certain components described herein can also be present in singular form. In some examples, the system 10 includes an additional device 30', which in this example is a docking station for the audio devices (earbuds 30). In various implementations, the docking station 30' is configured to house the earbuds 30A, 30B (e.g., for storage) and in some cases can include a power source or connection to a power source for charging the earbuds 30A, 30B. Receptacles (e.g., slots, seats, or other openings) 25 are shown in phantom within the docking station 30' for holding the earbuds 30A, 30B. The receptacles 25 can each be sized to receive an earbud 30A, 30B.

FIG. 2 depicts an additional example system 10, including a speaker system 20 having at least two audio devices 30, which in this example include distinct speakers 30A, 30B. For example, each of the speakers 30A, 30B can include portable speakers such as Wi-Fi and/or Bluetooth-enabled speakers that have the ability to function in a direct power mode (e.g., direct connection to external power source) and/or a battery power mode. In some cases, the speakers 30A, 30B can be of a same type, for example, a same manufacturer and/or model of speaker. However, in additional cases, the speakers 30A, 30B can be distinct in terms of model and/or manufacturer. Similar to the system depicted in FIG. 1, each of the speakers 30A, 30B has an outer casing 65 that contains electronics 70, which can include components that form part of, or are otherwise connected with, an interface 80. It is understood that a number of devices described herein can utilize the features of the various implementations, and the devices shown and described with reference to FIG. 1 and FIG. 2 are merely illustrative.

Figure 3:
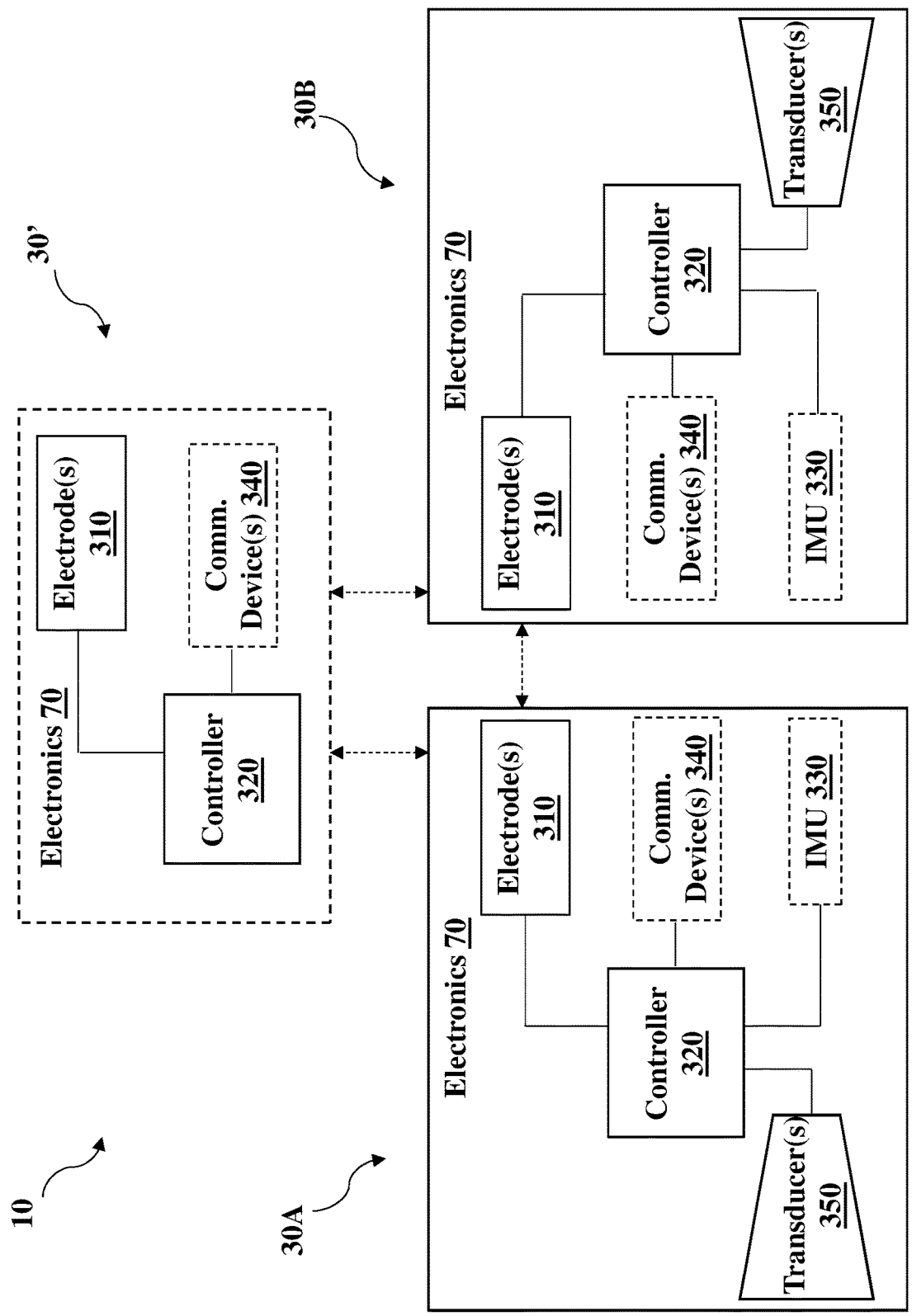
FIG. 3 is a system diagram illustrating electronics in devices within an audio system according to various implementations.

Electronics 70 in two audio devices 30A, 30B are depicted in schematic form in FIG. 3. Optionally, a third device 30' is shown. This third device 30' can include an audio device, e.g., having a transducer as depicted with respect to audio devices 30A and 30B. However, in other cases, the third device 30' is not an audio device, that is, this third device 30' is not capable of providing an audio output. This example is illustrated in FIG. 3, where the third device 30' is not an audio device, e.g., where the third device 30' is another electronic device such as a hub, docking and/or charging station, control device (e.g., remote control device), etc. In some cases, two-way communication is enabled between the audio devices 30A and 30B, however, in other cases, communication between these devices is in a single direction (e.g., in a master-puppet scenario). Additionally, two-way or one-way communication can be established between either or both of the audio devices 30A, 30B and the third device 30'.

It is understood that the devices 30 depicted in FIG. 3 can include any of the electronic devices described according to examples herein, for example, audio devices such as portable speakers, head or other body-worn speakers, and/or devices for connecting with these audio devices (e.g., docking and/or charging stations, communications equipment, audio gateways, etc.). It is understood that one or more of the components in electronics 70 may be implemented as hardware and/or software, and that such components may be connected by any conventional means (e.g., hard-wired and/or wireless connection). It is further understood that any component described as connected or coupled to another component in the devices 30 or other systems disclosed according to implementations may communicate using any conventional hard-wired connection and/or additional communications protocols. In some cases, communications protocol(s) can include a Wi-Fi protocol using a wireless local area network (LAN), a communication protocol such as IEEE 802.11 b/g a cellular network-based protocol (e.g., third, fourth or fifth generation (3G, 4G, 5G cellular networks) or one of a plurality of internet-of-things (IoT) protocols, such as: Bluetooth, BLE Bluetooth, ZigBee (mesh LAN), Z-wave (sub-GHz mesh network), 6LoWPAN (a lightweight IP protocol), LTE protocols, RFID, ultrasonic audio protocols, etc. In various particular implementations, separately housed components in the systems 10 disclosed herein are configured to communicate using one or more conventional wireless transceivers.

As shown in FIG. 3, electronics 70 contained within each device 30 can include at least one electrode 310 and a controller 320 coupled to the electrode(s) 310. In certain optional implementations (depicted in phantom), the electronics 70 can further include an inertial measurement unit (IMU) 330 for detecting movement of the device 30 (e.g., through one or more accelerometers, gyroscopes, and/or magnetometers) and enabling particular control functions. In certain optional cases, electronics 70 can also include one or more communications (comm.) devices 340 for sending communications signals to other device(s) 30, pairing devices 30, connecting with audio gateways, etc. In some optional examples, the electronics 70 can also include at least one transducer 350 for providing an audio output, e.g., in a speaker system or wearable audio device. One or more components in the electronics 70 can be connected with the controller 320, which is configured to perform control functions according to various implementations described herein.

The electrode 310 can include at least one capacitive electrode and/or at least one inductive electrode aiding in various devices functions described herein. In certain cases, for example, where the electrode 310 include a capacitive electrode, that capacitive electrode can be part of an interface (e.g., interface 80, FIGS. 1 and 2) such as a capacitive touch interface. In other cases, the electrode 310 can be dedicated to proximity detection functions described herein. In any case, the capacitive electrode can be configured to detect capacitive coupling with one or more other devices 30, or detect particular waveforms for identifying additional devices 30. In certain additional cases, the electrode 310 includes an inductive electrode (or, inductive sensor) configured to use electromagnetic induction to detect the presence of additional components such as devices 30 (e.g., audio devices). In any case, the electrode 310 in each device 30 is configured to detect an electrical waveform to aid in proximity detection and control functions described herein. In some specific cases, the electrode 310 is also configured to transmit an electrical waveform that is detectable by the electrode 310 in another device 30.

In additional optional implementations, proximity detection can be aided with an additional short-range wireless transmission system, e.g., in communication devices 340. In these cases, the short-range wireless transmission system can include a near-field communication (NFC) system and/or Bluetooth communication system. These wireless transmission systems can be used to detect, or confirm device proximity, e.g., using signal strength as a measure of physical proximity.

Returning to FIG. 3, in various implementations, the controller 320 in audio devices 30A and/or device 30B can include a processor (e.g., including a logic engine) to execute instructions for detecting proximity between the audio devices 30A and 30B (and in some cases, proximity with additional devices 30'), and controlling device functions. In some cases, a memory is coupled with the processor to store the instructions. In other implementations, the processor can otherwise access the instructions, e.g., from a remote storage system such as a server connected with one or more devices 30. When executed by the processor in the controller 320, the instructions cause the processor to detect proximity between devices 30 and take a prescribed action according to that detection. In some cases, the instructions are part of an application, such as a device detection application, which can be accessed via the server or locally stored in memory, e.g., at the controller 320 or in another storage system in the device(s) 30. The memory at the device(s) can include, for example, flash memory and/or non-volatile random access memory (NVRAM). In some implementations, instructions (e.g., software such as a device detection application) are stored in an information carrier. The instructions, when executed by one or more processing devices, perform one or more processes, such as those described elsewhere herein. The instructions can also be stored by one or more storage devices, such as one or more (e.g. non-transitory) computer- or machine-readable mediums (for example, the memory, or memory on the processor). As described herein, the memory can include instructions, or the processor can otherwise access instructions for detecting device proximity and taking a prescribed action according to various particular implementations. It is understood that portions of the memory (e.g., instructions) can also be stored in a remote location or in a distributed location, and can be fetched or otherwise obtained by the processor (e.g., via any communications protocol described herein) for execution.

The IMU 330 can include a microelectromechanical system (MEMS) device that combines a multi-axis accelerometer, gyroscope, and/or magnetometer. It is understood that additional or alternative sensors may perform functions of the IMU 330, e.g., an optical-based tracking system, accelerometer, magnetometer, gyroscope or radar for detecting movement as described herein. The IMU 330 can be configured to detect changes in the physical location/orientation of the device 30, and provide updated sensor data to the controller 320 in order to indicate a change in the location/orientation of the audio device 30. However, it is understood that the electronics 70 can also include one or more optical or visual detection systems located at the audio device 30 or another connected device configured to detect the orientation of the audio device 30. The communication device(s) 340 can include one or more wireless transceivers configured to communicate over any communications protocol described herein. The transducer 350 can include at least one electroacoustic transducer for producing an acoustic output, for example into, or proximate, the ears of a user in the case of a wearable audio device, or into an environment at one or more firing directions in the case of a speaker system.

Additional components included in electronics 70 and not necessarily depicted can include power source(s), signal amplification and other digital signal processing (DSP) hardware and/or software, active noise reduction (ANR) and/or controllable noise cancelling (CNC) systems, input/output (I/O) devices, displays and/or user interfaces (UIs), etc. It is understood that these components or functional equivalents of these components can be connected with, or form part of, the controller 320. It is understood that where the device 30 is a smart device such as a smartphone, smart speaker, smart wearable device (e.g., smart watch), tablet computing device, etc., the electronics 70 can include various additional components not depicted, for example, components enabling smart device functions, audio gateway functions and additional processing.

In various implementations, the controller 320 in one or more devices 30 (e.g., audio device 30A, 30B) is configured to perform functions in device detection and control. Distinct functions are illustrated in the following sections.

Proximity Detection

In one particular implementation, the controller 320 in a first one of the audio devices 30A is configured to instruct the electrode 310 at that audio device 30A to transmit an electrical waveform that is detectable by the electrode 310 in another device, e.g., audio device 30B. In various implementations, the waveform includes a capacitive waveform or an inductive waveform that is detectable within a certain physical proximity (e.g., approximately several centimeters or less). In some cases, the waveform (or set of waveforms) is transmitted with signal characteristics that are known to controllers 320 at the audio devices 30A, 30B. That is, in various implementations, the waveform is transmitted at a frequency and/or amplitude known to the controller 320 at one or more receiving audio devices (e.g., audio device 30B) or additional devices 30'. In certain implementations, the controllers 320 can communicate with one another to define waveform(s) for proximity detection, e.g., in terms of signal characteristics, prior to transmitting the waveform(s). For example, the controllers 320 can predefine the waveform characteristics, or an application (e.g., proximity detection application) running at the controllers can predefine these waveform characteristics to aid in device proximity detection.

In any case, the controller 320 initiates transmission of the waveform from the electrode 310 to detect physical proximity of another device, e.g., another audio device 30A. In the example systems in FIGS. 1 and 2, this approach can include detecting physical proximity between earbuds (FIG. 1) or speakers (FIG. 2). As described herein, in response to detecting the physical proximity of the first audio device 30A, the controller 320 in the second audio device 30B is configured to initiate a proximity-based action.

In certain example implementations, the controller 320 in the second audio device 30B is further configured to instruct the electrode 310 at that audio device 30B to transmit a second, distinct electrical waveform that is detectable by the electrode 310 in the first audio device 30A for indicating physical proximity between the audio devices 30A, 30B. In these cases, as described herein, in response to detecting the physical proximity of the second audio device 30B, the controller 310 in the first audio device 30A is configured to initiate a proximity-based action. In certain cases, the controllers 310 at audio devices 30A, 30B can initiate the same, or distinct, proximity-based actions in response to detecting physical proximity of the audio devices 30A, 30B. In still further implementations, the controller(s) 320 are configured to instruct corresponding electrodes 310 to continuously transmit the waveforms for detection by one or more electrodes 310 at a distinct one of the devices, e.g., an additional audio device.

In particular example implementations, the audio devices 30A, 30B each include a clasping magnet for drawing the audio devices 30A, 30B together when within magnetic field range of one another. The clasping magnet may be particularly applicable to the earbud form of audio devices 30A, 30B illustrated in FIG. 1. As shown in this implementation, each audio device 30A, 30B can include a clasping magnet 90 (illustrated in phantom as located within the outer casing 65) for drawing the audio devices 30A, 30B together when located within range of the magnetic field from the magnets 90. In certain implementations, the range of the magnetic field is approximately equal to or greater than the range of the electrical waveform for detecting proximity. In these cases, the magnets 90 draw the audio devices 30A, 30B together when located within the magnetic field range, and concurrently or subsequently, the controller(s) 320 in the audio devices 30A, 30B are configured to detect the physical proximity between those devices based upon detected electrical waveform(s), e.g., via the electrodes 310.

Proximity-Based Action(s)

As noted herein, in response to detecting the waveform at the electrode 310 in an audio device (e.g., audio device 30A or 30B), the controller 320 in that audio device initiates a proximity-based action. In some cases, the proximity-based action can include switching the device 30 to a hibernate mode, or powering down the device 30. For example, in some cases, detecting physical proximity between audio devices 30A, 30B indicates that those devices are not in use. For example, in the case of the earbuds depicted in FIG. 1, detecting physical proximity (e.g., of several centimeters or less) between audio devices 30A, 30B indicates that the earbuds are not worn by a user. That is, the physical separation between the devices 30A, 30B is too small for both devices to be in the user's ears. In these cases, the controller 320 at one or both devices 30A, 30B can switch the device(s) into a sleep mode or hibernate mode (e.g., disabling particular device functions to reduce battery usage), or power down those devices. This change in operating mode can extend battery life and/or control device functions based upon likely usage.

In additional implementations, for example, in the case of the earbuds depicted in FIG. 1, the controller 320 at the first audio device 30A is configured to instruct the electrode 310 (at that audio device 30A) to transmit the electrical waveform on a recurring basis, for example, periodically or approximately continuously for a period or while the device 30A is powered on. In still further cases, the controller 320 at the first audio device 30A is configured to instruct the electrode 310 (at audio device 30A) to transmit the electrical waveform on a recurring basis after having detected an electrical waveform from the second audio device 30B indicating that the devices 30A, 30B are in physical proximity. That is, the electrode 310 at audio device 30A can send a recurring electrical waveform that is detectable by the electrode 310 at audio device 30B in response to detecting the waveform sent from the electrode at audio device 30B. In these cases, the recurring waveform transmission can be used to detect whether the audio devices 30A, 30B become physically separated (e.g., outside of the physical proximity range) after detecting that these audio devices 30A, 30B were located physically proximate one another.

In certain implementations, where the controller 320 in the second audio device 30B has already taken a proximity-based action (e.g., detecting proximity between devices 30A, 30B), the controller 320 in that second audio device 30B is configured to take a separation-based action in response to failing to detect an electrical waveform sent by the electrode 310 at the first audio device 30A. For example, where the second audio device 30B is in a sleep or hibernate mode, the controller 320 in that second audio device 30B is configured to wake the second audio device 30B to provide an audio output (e.g., at transducer 350) in response to failing to detect the electrical waveform sent by the first audio device 30A.

In additional implementations, proximity-based actions can include pairing or connecting the first audio device 30A and the second audio device 30B. In these cases, detecting the proximity between audio devices 30A, 30B can indicate that these devices are capable of pairing or connecting, e.g., via Bluetooth or BLE connection, Zigbee connection or other device-to-device connection described herein or known in the art. In the example of a first audio device 30A being an audio gateway such as a smart phone, tablet or other smart device, and the second device 30B being a speaker, detecting proximity between the audio devices 30A, 30B enables the controllers 320 to pair the audio devices 30A, e.g., for playback of audio from the audio gateway at the speaker. This configuration can also be applied in cases where one of the devices 30 is not an audio device, i.e., that device does not have independent audio playback capability. In any case, the controller 320 can be configured to pair the first audio device 30A and the second audio device 30B in response to detecting physical proximity between the devices.

In another example, in the cases of speakers such as those illustrated in FIG. 2, detecting proximity between audio devices 30A, 30B can enable pairing or connecting speakers to form a stereo coupled unit. This stereo coupled unit can be configured to output audio collectively, e.g., as a stereo pair, or as part of a larger stereo speaker configuration (e.g., including three or more speakers). In this example, where the first audio device 30A is a first speaker and the second audio device 30B is a second, distinct speaker, the proximity-based action can further include assigning channel outputs for the distinct speakers to configure audio playback at those speakers as a stereo coupled unit. In particular cases, in the process of pairing or connecting the first audio device 30A and the second audio device 30B, the controller(s) 320 at one or more of the audio devices 30A can assign channel outputs to distinct speakers in the stereo coupled unit. For example, the controller(s) 320 can assign left, right and center channels (and variations) to output at one or more transducers 350 at each audio device 30A, 30B.

In particular examples, such as the multi-speaker example illustrated in FIG. 2, each of the audio devices 30A, 30B includes at least two electrodes 310 on opposing sides of the speaker housing (e.g., a left side and a right side, a top and a bottom, and/or a front and a back). In these cases, the electrodes 310 in each side of the speaker housing can be configured to transmit and/or receive waveforms for proximity detection. In these cases, the controller 320 at a given audio device 30A is configured to transmit distinct waveforms from the left and right electrodes 310, respectively, such that at least one of the electrodes 310 at a distinct audio device 30B can detect one or more of the distinct waveforms. In a particular example, for the same audio device 30A, a left electrode 310 transmits a distinct waveform than the right electrode 310, both with a limited range (e.g., up to several centimeters). In these cases, a closest electrode 310 in a second audio device 30B will only detect one of the waveforms transmitted from the first audio device 30A. The controller 320 at the second audio device 30B, knowing the characteristics of the distinct waveforms, can determine whether the detected waveform is transmitted from the left electrode 310 or the right electrode 310, and based upon that determination, detects the left/right orientation of the audio devices 30A, 30B. In these cases, the controller(s) 320 assign channel inputs based upon the left/right orientation of the audio devices 30A, 30B. For example, the controller(s) 320 assign left channel output to the left speaker (e.g., left-firing transducer(s) at the left speaker) and assign right channel output to the right speaker (e.g., right-firing transducer(s) at the right speaker). In some cases, the channel assignment can remain in place until the audio devices 30A are disconnected, or pairing is terminated. In these examples, a user can effectively pair or connect audio devices 30A, 30A (and in some cases configure channel assignments) by placing the audio devices 30A, 30B within physical proximity range of the waveforms detectable by the electrodes 310. This pairing and/or connection can be maintained even when the audio devices 30A, 30B are moved beyond this physical proximity range defined by the range of the detectable waveforms.

In additional examples, such as the multi-speaker stereo coupled configuration described above with respect to FIG. 2, a first audio device (e.g., first speaker) 30A is a master speaker and a second audio device (e.g., second speaker) 30B is a puppet speaker. In these cases, the controller 320 at the first speaker 30A is configured to decouple the stereo coupled unit in response to detecting that the second speaker 30B is physically separated from the master speaker 30A beyond a wireless communication range. For example, in response to failing to detect a wireless communication link (e.g., common Wi-Fi network connection, BLE connection range, etc.) between the master speaker 30A and the puppet speaker 30B, the controller 320 at the master speaker 30A is configured to disconnect or terminate playback pairing between the speakers. In these cases, after the controller 320 at the master speaker 30A removes the pairing or otherwise disconnects the speakers 30A, 30B, the controller 320 at each speaker 30A, 30B reverts to channel assignments for each speaker as a stand-alone playback system.

In another example, as depicted in FIG. 2, the first device 30A includes a speaker, and the second device 30' includes a control device for the speaker (e.g., a remote control unit or a smart device). The control device can be configured to control one or more device functions, for example, remotely via wireless communication. In these cases, in response to detecting the electrical waveform from the first device 30A at the electrode 310 in the second device 30', the controller 320 in that second device 30' is configured to take one or more proximity-based actions, for example, sending a signal (to controller 320 at speaker 30A) to power down the speaker 30A, sending a signal (to controller 320 at speaker 30A) to switch the speaker 30A to hibernate mode, or pairing or connecting the control device 30' with the speaker 30A. In some cases, detecting physical proximity between the control device 30' and the speaker 30A indicates that the control device 30' is not in use, and in these cases, where playback is not currently occurring at the speaker 30A, the proximity-based action can include powering down the speaker 30A or switching the speaker 30A to hibernate mode. In still other cases, detecting physical proximity between the control device 30' and the speaker 30A indicates that the user wishes to pair or connect the control device 30' with the speaker 30A. In these implementations, the controller 320 at the control device 30' can detect physical proximity with the speaker 30A (as described herein), and based upon that detected physical proximity, verifies whether the control device 30' and the speaker 30A have been previously paired or connected, and if no prior pairing or connection has been made (or such connection cannot be re-established), sends a request to pair or connect the control device 30' with the speaker 30A.

In still further examples, such as the system 10 depicted in FIG. 1 including audio devices 30A, 30B and a third device 30' that is a docking station for the audio devices 30A, 30B, the electrical waveform sent by the electrode 310 at the docking station 30' is detectable by the electrode 310 in each of the audio devices 30A, 30B for indicating physical proximity of those audio devices 30A, 30B to the docking station 30'. In these cases, in response to detecting the electrical waveform, the controller 320 in the first audio device 30A and/or the second audio device 30B is configured to initiate a proximity-based action, for example, where proximity indicates that the audio device(s) 30A, 30B is docked in the docking station 30'. In certain example implementations, the proximity-based action includes powering down the audio devices 30A, 30B or terminating audio playback at the audio devices 30A, 30B.

In still further implementations including audio devices 30A, 30B and the docking station 30' (e.g., FIG. 1), the controller 320 in each of the audio devices 30A, 30B is configured to instruct its respective electrode 320 to transmit a distinct electrical waveform that is detectable by the electrode 310 in the other audio device 30A or 30B, or the docking station 30' for indicating physical proximity to the other audio device 30A or 30B or the docking station 30'. In these cases, the controllers 320 in the audio devices 30A, 30B initiate transmission of electrical waveforms that differ from one another, and from the electrical waveform(s) transmitted by the docking station 30'. In response to detecting the electrical waveform from one of the audio devices (e.g., audio device 30A), the controller 320 in the other audio device (e.g., audio device 30B) or the docking station 30' is configured to initiate the proximity-based action, for example, where proximity indicates that one of the audio devices 30A, 30B is docked in the docking station 30', or that the audio devices 30A, 30B are located within a physical proximity such that they are not in use.

In further specific examples, the electrode 310 in each of the audio devices 30A, 30B is a capacitive electrode. In these examples, the capacitive electrode in the first audio device 30A is a capacitive touch electrode. This may be particularly beneficial where the audio devices 30 include an interface 80 for receiving touch-based user commands, e.g., in wearable audio devices such as the earbuds depicted in FIG. 1 or in speakers such as those depicted in FIG. 2. In these cases, the capacitive touch electrode is configured to perform both capacitive touch detection (e.g., via interface 80) and aid in device proximity detection with one or more additional devices 30. For example, the controller 320 in the first audio device 30A is configured to alternate, in a repeating pattern, between: i) instructing the electrode 310 (i.e., capacitive touch electrode) in the first audio device 30A to transmit the electrical waveform detectable by the electrode 310 (i.e., capacitive electrode) in the second audio device 30B, and ii) instructing the electrode 310 in the first audio device 30A to transmit an additional electrical waveform for detecting a user touch command at a capacitive touch interface (e.g., interface 80) connected with the electrode 310 in the first audio device 30A. In various implementations, the electrical waveform and the additional electrical waveform differ in terms of repetition frequency (e.g., every N seconds versus every N+X seconds), and/or in terms of transmission pattern (e.g., X waveforms sent successively every N seconds versus a single waveform sent in alternating patterns every Y, and then Z seconds). In these cases, the electrical waveform(s) used for detecting proximity between audio devices can differ from the electrical waveform(s) used to detect a user touch command.

In any case, the audio systems 10 described herein can enable efficient and effective proximity-based device control. In various implementations, the audio systems 10 disclosed according to various implementations are configured to perform ongoing, or continuous device proximity detection while consuming minimal computational resources and/or device power. In still further implementations, the audio systems 10 enable devices to conserve power by dynamically switching between operating modes based upon detected proximity. In any case, the audio systems 10 disclosed according to various implementations have the technical effect of detecting device proximity and enabling proximity-based actions.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawings.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

I claim:

1. An audio system comprising:
a set of audio devices, each comprising:
an electrode for detecting an electrical waveform, wherein the electrode comprises at least one of a capacitive electrode or an inductive electrode; and
a controller coupled to the electrode,
wherein the controller in a first one of the audio devices is configured to instruct the electrode in the first audio device to transmit an electrical waveform that is detectable by the electrode in a second one of the devices for indicating physical proximity of the first audio device to the second audio device, and in response to detecting the electrical waveform, the controller in the second audio device initiates a proximity-based action,
wherein the electrode in the first audio device comprises the capacitive electrode comprising a capacitive touch electrode, wherein the electrode in the second audio device comprises the capacitive electrode, and wherein the controller in the first audio device is configured to alternate, in a repeating pattern, between:
instructing the capacitive electrode in the first audio device to transmit the electrical waveform detectable by the capacitive electrode in the second audio device, and instructing the capacitive electrode in the first audio device to transmit an additional electrical waveform for detecting a user touch command at a capacitive touch interface connected with the capacitive touch electrode.

2. The audio system of claim 1, wherein the controller in the second audio device is configured to instruct the electrode in the second audio device to transmit a distinct electrical waveform that is detectable by the electrode in the first audio device for indicating physical proximity of the first audio device to the second audio device, and in response to detecting the distinct electrical waveform, the controller in the first audio device initiates the proximity-based action.

3. The audio system of claim 1, wherein the first audio device and the second audio device each comprise an acoustic transducer coupled with the respective controllers, wherein the audio devices comprise a set of earbuds,
wherein detecting the electrical waveform indicates that the earbuds are not worn by a user.

4. The audio system of claim 3, wherein the controller in the first audio device is configured to instruct the electrode to transmit the electrical waveform on a recurring basis, and in response to failing to detect the electrical waveform, the controller in the second audio device is configured to wake the second audio device to provide an audio output, wherein the controller in the second audio device is configured to wake the second audio device after having previously taken the proximity-based action.

5. The audio system of claim 1, wherein the proximity-based action comprises switching the second audio device to a hibernate mode, powering down the second audio device, pairing or connecting the first audio device and the second audio device, or pairing or connecting at least one of the first audio device or the second audio device to an audio playback device,
wherein each audio device comprises at least one communications device, and wherein the electrode for detecting the electrical waveform is separate from the at least one communications device, and
wherein the controller in at least one of the audio devices predefines characteristics of the waveform to aid in device proximity detection.

6. The audio system of claim 1, wherein the first audio device and the second audio device each comprise distinct speakers, and wherein the proximity-based action comprises assigning channel outputs for the distinct speaker systems to configure audio playback at the distinct speakers as a stereo coupled unit.

7. The audio system of claim 6, wherein the distinct speakers each comprise at least two electrodes on opposing sides of a speaker housing, wherein assigning the channel outputs is based upon a detected left/right orientation of the distinct speakers relative to one another.

8. The audio system of claim 6, wherein the first audio device comprises a master speaker and the second audio device comprises a puppet speaker, and wherein the controller at the master speaker is configured to decouple the stereo coupled unit in response to detecting that the puppet speaker is physically separated from the master speaker beyond a wireless communication range.

9. The audio system of claim 1, wherein the first audio device comprises a speaker, wherein the second audio device comprises a control device for the speaker, and wherein the proximity-based action comprises powering down the speaker, switching the speaker to a hibernate mode, or selectively pairing or connecting the control device with the speaker.

10. The audio system of claim 1, wherein the set of audio devices comprises a third device, wherein the second audio device and the third device are audio devices each with an acoustic transducer coupled with the respective controllers, wherein the first audio device comprises a docking station for the audio devices, and wherein the electrical waveform sent by the docking station is detectable by the electrode in each of the second audio device and the third device for indicating physical proximity of the audio devices and the docking station, and in response to detecting the electrical waveform, the controller in at least one of the second audio device or the third device initiates the proximity-based action.

11. The audio system of claim 10, wherein the controller in each of the audio devices is further configured to instruct the respective electrode to transmit a distinct electrical waveform that is detectable by the electrode in at least one of the other audio device or the docking station for indicating physical proximity to at least one of the other device or the docking station, and in response to detecting the electrical waveform, the controller in the respective audio device or the docking station initiates the proximity-based action.

12. The audio system of claim 10, wherein the proximity-based action comprises at least one of powering down the audio devices or terminating audio playback at the audio devices.

13. The audio system of claim 1, wherein the electrode in each audio device is dedicated to indicating physical proximity of the first audio device to the second audio device.

14. The audio system of claim 3, wherein each audio device comprises a clasping magnet for drawing the audio devices together when located within a magnetic field range, and wherein the physical proximity is equal to approximately several centimeters or less.

15. A computer-implemented method of controlling a set of audio devices, each comprising an electrode for detecting an electrical waveform and a controller coupled to the electrode, wherein the electrode comprises at least one of a capacitive electrode or an inductive electrode, the method comprising:
at the controller in a first one of the audio devices: instructing the electrode to transmit an electrical waveform that is detectable by the electrode in a second one of the audio devices for indicating physical proximity of the first audio device to the second audio device; and
at the controller in the second audio device: initiating a proximity-based action in response to detecting the electrical waveform,
wherein the first audio device and the second audio device each comprise distinct speakers, and
wherein the proximity-based action comprises assigning channel outputs for the distinct speaker systems to configure audio playback at the distinct speakers as a stereo coupled unit.

16. The method of claim 15, further comprising:
at the controller in the second audio device: instructing the electrode in the second audio device to transmit a distinct electrical waveform that is detectable by the electrode in the first audio device for indicating physical proximity of the devices; and
at the controller in the first audio device: initiating the proximity-based action in response to detecting the distinct electrical waveform.

17. The method of claim 15, wherein the first audio device and the second audio device each comprises an acoustic transducer coupled with the respective controllers, wherein the audio devices are part of a set of earbuds, wherein detecting the electrical waveform indicates that the earbuds are not worn by a user, and wherein the electrical waveform is transmitted on a recurring basis,
the method further comprising, at the controller in the second audio device: waking the second audio device to provide an audio output in response to failing to detect the electrical waveform, wherein the second audio device is awoken after having previously taken the proximity-based action.

18. The method of claim 15, wherein the distinct speakers each comprise at least two electrodes on opposing sides of a speaker housing, and wherein assigning the channel outputs is based upon a detected left/right orientation of the distinct speakers relative to one another,
wherein the first audio device comprises a master speaker and the second audio device comprises a puppet speaker, the method further comprising:
at the controller in the master speaker, decoupling the stereo coupled unit in response to detecting that the puppet speaker is physically separated from the master speaker beyond a wireless communication range.

\* \* \* \* \*